(12) United States Patent
Xu et al.

(10) Patent No.: US 7,527,997 B2
(45) Date of Patent: May 5, 2009

(54) MEMS STRUCTURE WITH ANODICALLY BONDED SILICON-ON-INSULATOR SUBSTRATE

(75) Inventors: Bai Xu, Slingerlands, NY (US); Natalya Tokranova, Cohoes, NY (US); James Castracane, Albany, NY (US)

(73) Assignee: The Research Foundation of State University of New York, Albany, NY (US)

( * ) Notice: Subject to any disclaimer, the term of this patent is extended or adjusted under 35 U.S.C. 154(b) by 338 days.

(21) Appl. No.: 11/101,861

(22) Filed: Apr. 8, 2005

(65) Prior Publication Data

US 2006/0228823 A1   Oct. 12, 2006

(51) Int. Cl.
H01L 21/00    (2006.01)

(52) U.S. Cl. .................................. 438/52; 257/E21.122

(58) Field of Classification Search ............. 438/50–53; 257/E21.122
See application file for complete search history.

(56) References Cited

U.S. PATENT DOCUMENTS

| | | | |
|---|---|---|---|
| 5,320,705 A | 6/1994 | Fujii et al. ................... 156/630 |
| 5,490,034 A | 2/1996 | Zavracky et al. ......... 361/283.4 |
| 5,511,428 A | 4/1996 | Goldberg et al. ............. 73/777 |
| 6,229,190 B1 | 5/2001 | Bryzek et al. ................ 257/419 |
| 6,426,013 B1 | 7/2002 | Neukermans et al. ......... 216/24 |
| 6,507,187 B1 | 1/2003 | Olivas et al. ........... 324/207.21 |
| 6,516,671 B2 | 2/2003 | Romo et al. .................. 73/718 |
| 6,518,084 B1 | 2/2003 | Seitz et al. ..................... 438/53 |
| 6,582,985 B2 | 6/2003 | Cabuz et al. .................. 438/48 |
| 6,673,694 B2 | 1/2004 | Borenstein .................. 438/411 |
| 6,706,549 B1 | 3/2004 | Okojie ......................... 438/52 |
| 2002/0097118 A1 | 7/2002 | Siekkinen et al. ............. 335/78 |
| 2002/0118850 A1 | 8/2002 | Yeh et al. ..................... 381/313 |
| 2002/0127760 A1 | 9/2002 | Yeh et al. ...................... 438/50 |
| 2002/0179921 A1 | 12/2002 | Cohn ........................... 257/99 |
| 2003/0029245 A1 | 2/2003 | Izadnegahdar et al. ........ 73/753 |
| 2003/0039089 A1 | 2/2003 | Lee et al. .................. 361/283.1 |
| 2003/0062332 A1 | 4/2003 | Harris et al. ................... 216/2 |
| 2003/0072127 A1 | 4/2003 | Zias et al. ................... 361/311 |
| 2003/0079547 A1 | 5/2003 | Baek ........................... 73/716 |
| 2004/0099921 A1* | 5/2004 | Brady ......................... 257/452 |
| 2004/0182165 A1* | 9/2004 | Miyashita .................... 73/718 |

OTHER PUBLICATIONS

Hyun S. Kim, et al., "Bonding silicon-on-insulator to glass wafers for integrated bio-electronic circuits," Applied Physics Letters, vol. 85, No. 12, Sep. 20, 2004.

* cited by examiner

Primary Examiner—Thao X Le
Assistant Examiner—Elias Ullah
(74) Attorney, Agent, or Firm—Wayne F. Reinke, Esq.; Heslin Rothenberg Farley & Mesiti P.C.

(57) ABSTRACT

A silicon-on-insulator (SOI) substrate is anodically bonded to a glass substrate in a MEMS structure with or without electrically bypassing the insulator layer by electrically comprising the silicon layers. The insulator layer serves as an etch stop to create a well-defined, thin silicon membrane for a sensor. A second glass substrate is anodically bonded to the other side of the SOI substrate, and debonding of the existing anodic bond prevented by eliminating any potential drop across the existing bonded surface.

5 Claims, 8 Drawing Sheets

MEMS STRUCTURE WITH ANODICALLY BONDED SILICON-ON-INSULATOR SUBSTRATE

BACKGROUND OF THE INVENTION

1. Technical Field

The present invention generally relates to Micro-Electro-Mechanical Systems (MEMS). More particularly, the present invention relates to a MEMS structure including an anodically bonded silicon-on-insulator substrate.

2. Background Information

There has been a wide range of fabrication methods developed to fabricate microsensors and microactuators. These devices can be used for sensing, measurement and displacement in the range of micrometers or sub-micrometers. The sensitivity of such kind of devices can be high because of their extremely small dimensions. But their fabrication is quite a challenge due to the strict requirement of process reproducibility and wafer uniformity. Conventional fabrication methods have inherent non-uniformity across full wafer size in both thin film deposition and etching.

It is a common practice to form a heavily B-doped silicon layer and use this as an etch stop to construct a thin silicon membrane. However, there are three key disadvantages associated with the use of a heavily boron-doped silicon layer. One is that the boron doping process requires a long drive-in time. If the silicon membrane thickness is large, it becomes practically impossible to fabricate a freely suspended membrane. The second disadvantage is that the etch chemical is very toxic to allow an acceptable etch stop on boron-doped silicon. Heavy silicon doping also introduces stress into the fabricated silicon membrane and performance degradation can result. A non-uniform boron doping profile (boron concentration decays as it goes deeper into the wafer) can also yield a membrane with a poorly defined interface.

Thus, a need exists for a way to make a well-defined thin silicon membrane for a sensor.

SUMMARY OF THE INVENTION

Briefly, the present invention satisfies the need for a well-defined thin silicon membrane for a sensor by incorporating an anodically bonded silicon-on-insulator (SOI) substrate with another substrate, the insulator layer serving as an excellent etch stop.

In accordance with the above, it is an object of the present invention to provide a well-defined, thin silicon membrane for a sensor.

It is another object of the present invention to provide a structure with a SOI substrate anodically bonded to a glass substrate.

It is another object of the present invention to provide a way to create a structure with a SOI substrate anodically bonded on each side to a glass substrate, such that creation of the second anodic bond does not degrade the first anodic bond.

The present invention provides, in a first aspect, a method of making a MEMS structure. The method comprises providing a SOI substrate and a second substrate. The SOI substrate has a first silicon layer, a second silicon layer and an insulator layer between the first silicon layer and the second silicon layer. The SOI substrate and second substrate are anodically bonded without electrically bypassing the insulator layer.

The present invention provides, in a second aspect, a method of making a MEMS structure. The method comprises providing a SOI substrate. The SOI substrate has a first silicon layer, a second silicon layer and an insulator layer between the first silicon layer and the second silicon layer. The method also comprises electrically isolating the insulator layer therein. The method further comprises providing a second substrate, and anodically bonding the SOI substrate and the second substrate.

The present invention provides, in a third aspect, a sensor. The sensor comprises a SOI substrate having a first silicon layer, a second silicon layer and an insulator layer between the first silicon layer and the second silicon layer, and a second substrate anodically bonded to the SOI substrate at the first silicon layer. The sensor further comprises a membrane in the first silicon layer, and at least one electrical contact coupled to the second substrate for detecting deflection of the membrane.

The present invention provides, in a fourth aspect, a method of making a sensor. The method comprises providing a SOI substrate having a first silicon layer, a second silicon layer and an insulator layer between the first silicon layer and the second silicon layer, and anodically bonding a second substrate to the SOI substrate at the first silicon layer. The method further comprises creating a membrane in the first silicon layer, and coupling at least one electrical contact to the second substrate for the detecting deflection of the membrane.

The present invention provides, in a fifth aspect, a MEMS structure. The structure comprises a SOI substrate having a first silicon layer, a second silicon layer and an insulator layer between the first silicon layer and the second silicon layer. The structure further comprises a first glass substrate anodically bonded by a first bond to the SOI substrate at the first silicon layer, and a second glass substrate anodically bonded by a second bond to the SOI substrate at the second silicon layer. The first bond and the second bond are roughly equal in strength.

The present invention provides, in a sixth aspect, a method of making a MEMS structure. The method comprises providing a SOI substrate having a first silicon layer, a second silicon layer and an insulator layer between the first silicon layer and the second silicon layer. The method further comprises anodically bonding a first glass substrate to the SOI substrate at the first silicon layer, thereby creating a first bond, and anodically bonding a second glass substrate to the SOI substrate at the second silicon layer, thereby creating a second bond. The method also comprises preventing debonding of the first bond during creation of the second bond.

These, and other objects, features and advantages of this invention will become apparent from the following detailed description of the various aspects of the invention taken in conjunction with the accompanying drawings.

DETAILED DESCRIPTION OF THE INVENTION

Figure 1:
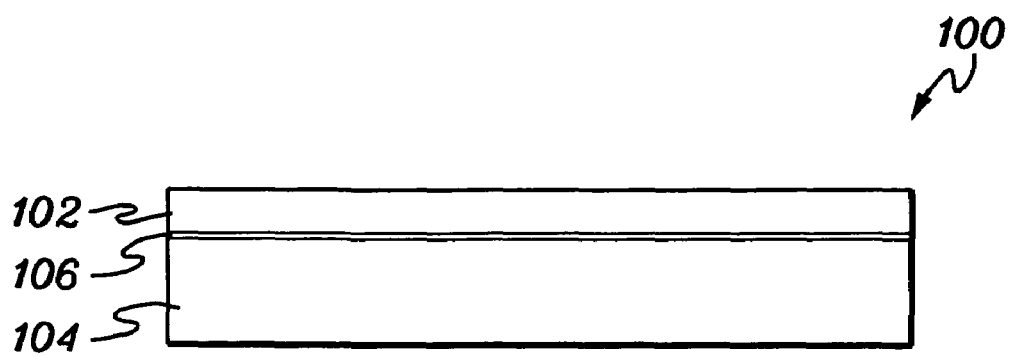
FIG. 1 is cross-sectional view of a silicon-on-insulator (SOI) substrate prior to processing in accordance with the present invention.

FIG. 1 is a cross-sectional view of a silicon-on-insulator (SOI) substrate 100 prior to processing thereof in accordance with the present invention. SOI substrate 100 comprises a first silicon layer 102, also referred to as the device layer, a second silicon layer 104, also referred to as the handle layer, and an insulator layer 106 therebetween. The insulator layer comprises silicon dioxide ($SiO_2$).

Figure 2:
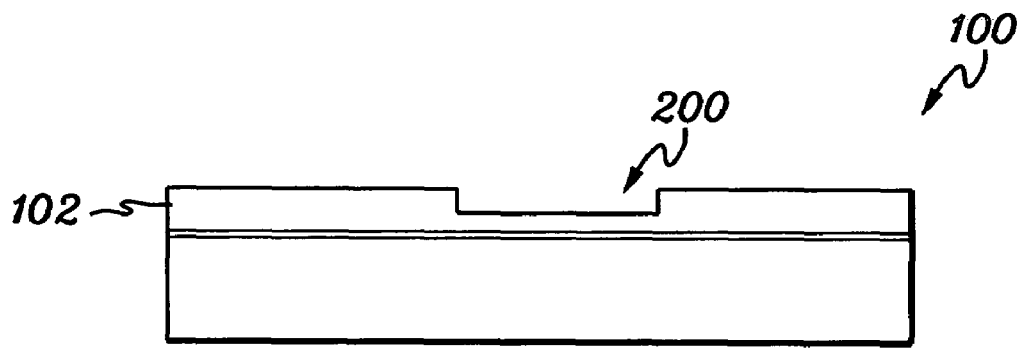
FIG. 2 depicts the SOI substrate of FIG. 1 after initial patterning and etching.

FIG. 2 depicts the SOI substrate 100 of FIG. 1 after photoresist patterning and etching to create a recess 200 in the device layer 102.

Figure 3:
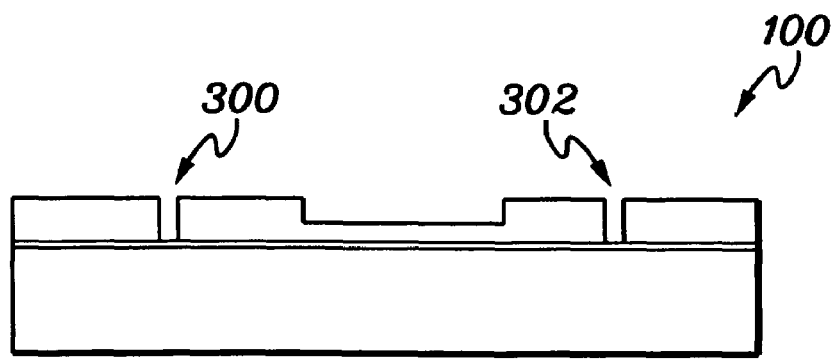
FIG. 3 depicts the SOI substrate of FIG. 2 after additional patterning and etching.

FIG. 3 depicts the SOI substrate 100 of FIG. 2 after the creation of trenches 300 and 302. The trenches are created, for example, by photoresist patterning and etching, using, for example, a Bosch process known in the art. As one skilled in the art will know, the Bosch process involves a sequence of alternating etch and deposition to fabricate high aspect ratio silicon structures while the substrate temperature is controlled near room temperature.

Figure 4:
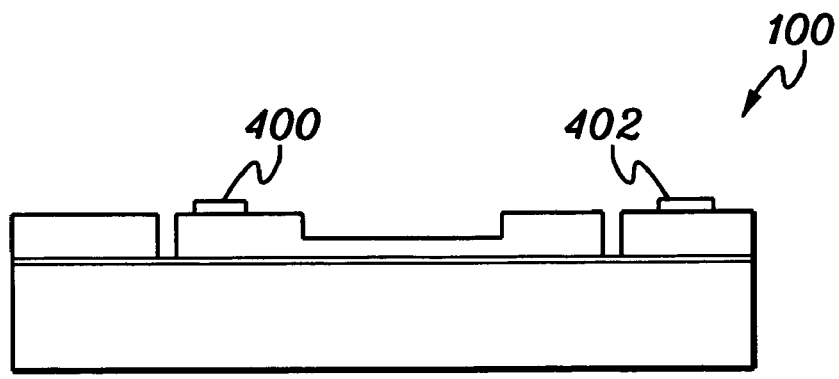
FIG. 4 depicts the SOI substrate of FIG. 3 after the creation of electrical contacts thereon.

FIG. 4 depicts the SOI substrate 100 of FIG. 3 after the creation of electrical contacts 400 and 402 thereon. The contacts comprise, for example, a multi layer metal film of gold (Au) and a titanium (Ti)/tungsten (W) alloy. The contacts can be created by, for example, sputtering the Ti/W alloy first as an adhesion layer, then the gold across the substrate, spinning photoresist on top of the gold, and patterning the photoresist to remove it everywhere except on top of where the contacts are desired. Finally, the metal film is removed everywhere except where it is protected by the photoresist, and then the remaining photoresist above the gold contacts is removed. Contacts 400 and 402 will provide external electrical contact points in use.

Figure 5:
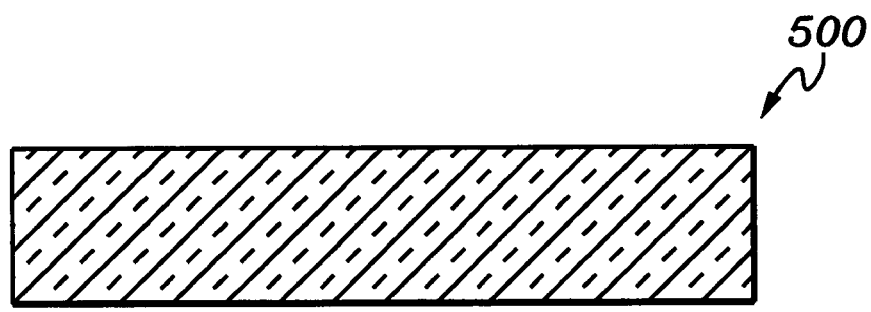
FIG. 5 is a cross-sectional view of a glass substrate prior to processing thereof in accordance with the present invention.

FIG. 5 is a cross-sectional view of a glass substrate 500 prior to processing thereof in accordance with the present invention. The glass substrate comprises, for example, PYREX 7740 available from Corning Corporation, Corning, N.Y. As another example, Hoya SD-2, available from Hoya Corporation USA in San Jose, Calif., could be used. In general, the glass that is used is rich in sodium (for anodic bonding, further described below), and has a thermal coefficient of expansion that closely matches that of silicon.

Figure 6:
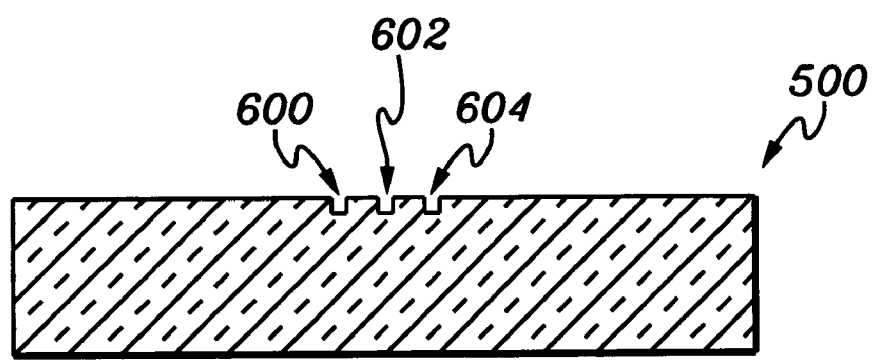
FIG. 6 depicts the glass substrate of FIG. 5 after patterning and etching.

FIG. 6 depicts the glass substrate 500 of FIG. 5 after creation of recesses 600, 602 and 604 therein. The recesses are created by, for example, standard photoresist patterning and etching techniques comprising either a dry or wet process, or a combination of both dry and wet.

Figure 7:
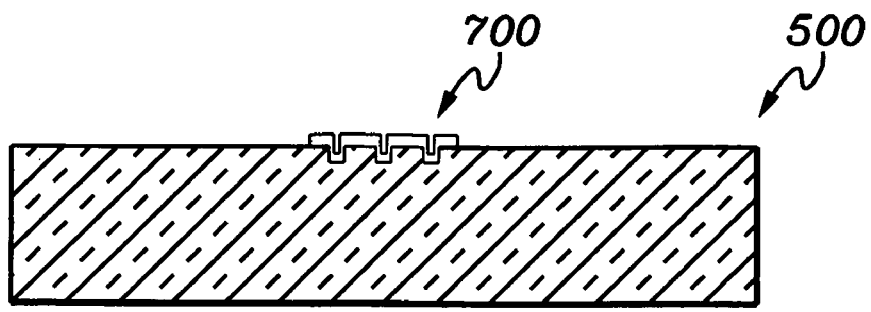
FIG. 7 depicts the glass substrate of FIG. 6 after creation of an electrical contact thereon.

FIG. 7 depicts the glass substrate 500 of FIG. 6 after creation of electrode and electrical contact 700 thereon. The contact comprises, for example, a multi layer metal film of gold and a tungsten/titanium alloy. The contact can be created, for example, by applying the metal film across the substrate surface, applying and patterning photoresist, and removing the metal film everywhere except where the contact is sought to be created. The remaining photoresist above the gold contact can then be removed.

Figure 8:
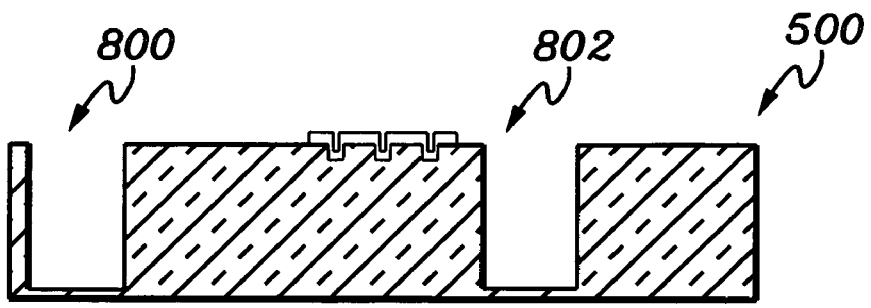
FIG. 8 depicts the glass substrate of FIG. 7 after ultrasonic drilling thereof.

FIG. 8 depicts the glass substrate 500 of FIG. 7 after creation of recesses 800 and 802 therein. The recesses can be created by, for example, ultrasonic drilling, plasma dry etch or laser drilling.

Figure 9:
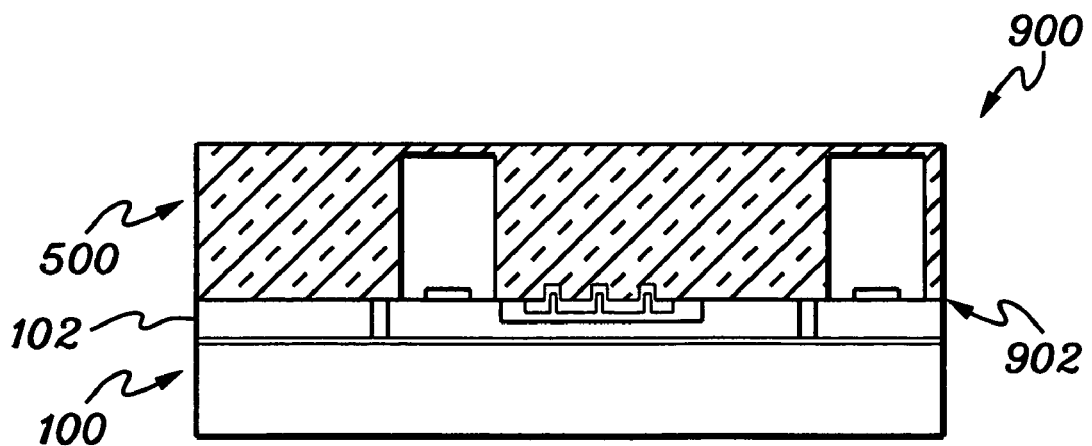
FIG. 9 depicts the SOI substrate of FIG. 4 and the glass substrate of FIG. 8 after anodic bonding thereof.

FIG. 9 depicts a semiconductor structure 900 in accordance with the present invention. Semiconductor structure 900 comprises glass substrate 500 and SOI substrate 100 anodically bonded at interface 902. As one skilled in the art will know, anodic bonding involves applying a high DC voltage potential of about 1000 V across the interface to generate an electric field, applying pressure of about 30,000 Pascal and exposing to temperatures of about 400° C., that together drive $Na^+$ ions in the glass substrate away from the interface region. A $Na^+$ depletion zone is thus formed that leaves oxygen atoms highly reactive at the interface. Oxygen atoms in device layer 102 of SOI substrate 100 form a chemical bond Si—O, which provides a strong bond between the substrates, due to the permanent covalent bond within the silicon dioxide that is formed.

Unexpectedly, it was found that anodic bonding could be accomplished with the SOI substrate without electrically bypassing the insulator layer. The natural assumption, due to the presence of the insulator layer in the SOI substrate, is that the insulator layer would prevent an electrical path from fully forming so as to enable the anodic bonding. However, it is now thought that the potential difference that is used in anodic bonding is enough to open a path in the insulator layer without electrically coupling the two silicon layers in the SOI substrate.

Figure 10:
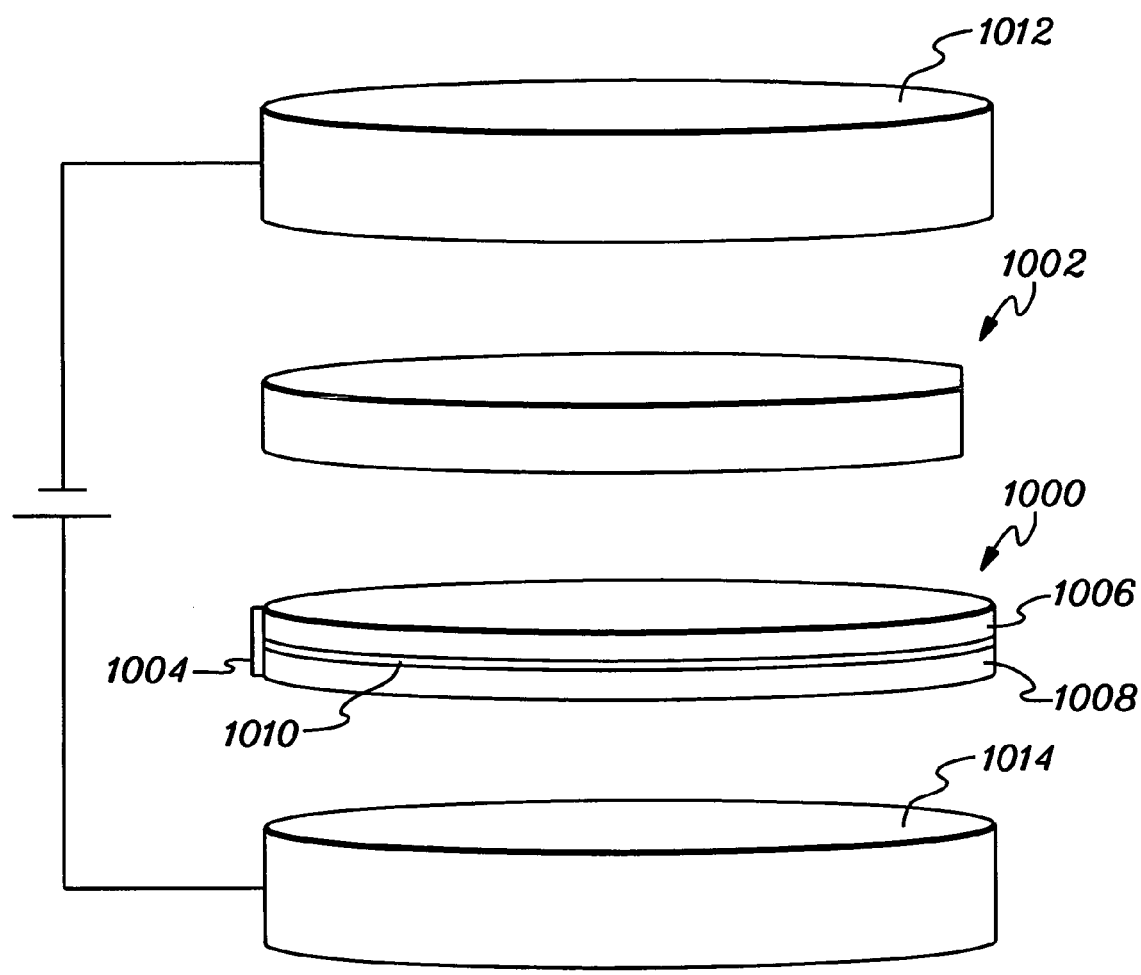
FIG. 10 is an exploded view of an alternative anodic bonding process for SOI and glass.

FIG. 10 depicts the anodic bonding of SOI wafer 1000 and glass wafer 1002 using an optional conductive path 1004 to electrically couple device layer 1006 and handle layer 1008, thereby electrically isolating the insulator layer 1010. Conductive path 1004 can be created in a number of ways, for example, the use of a metallic paste, the use of a metal clamp, or the use of metal sputtering deposition at the edge of the SOI wafer. Also shown in FIG. 10 are electrodes 1012 and 1014 for enabling the potential across an interface between the SOI and glass wafers. Although as noted with respect to FIG. 9, the conductive path between the silicon layers is not necessary for enabling anodic bonding, it is possible that the large potential used in anodic bonding may initially or eventually damage the insulator layer of the SOI wafer, or lead to a partial breakdown thereof. For example, depending on the quality of the oxide, an electric field strength on the order of $10^5$-$10^7$ V/cm can cause oxide breakdown. Finally, although not shown in FIG. 10, it will be understood by one skilled in the art that the flat of the glass and silicon wafers are rotated by 90 degrees with respect to each other in order to allow electrical contact to the silicon wafer and assist with coarse alignment.

Figure 11:
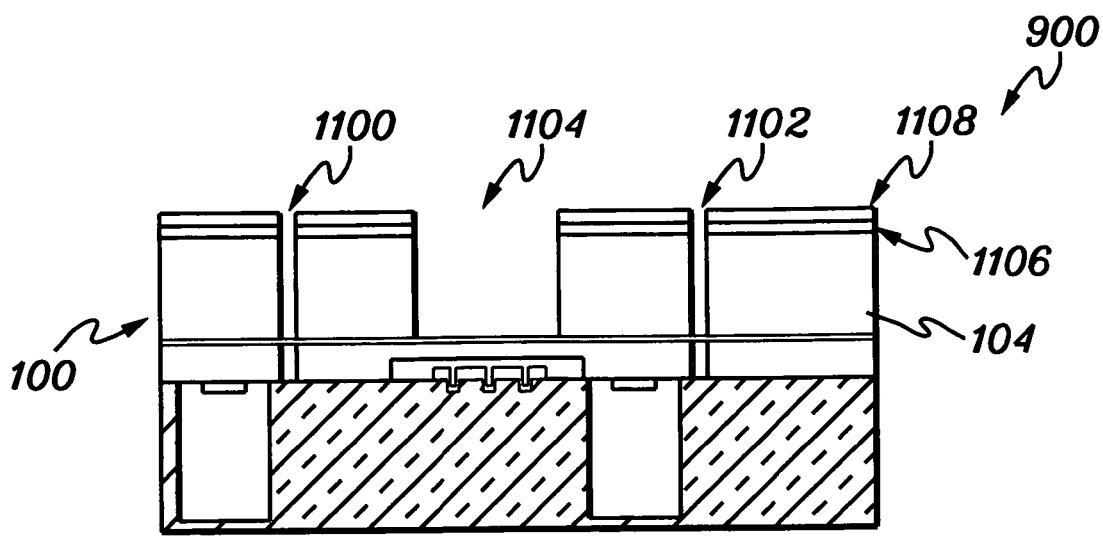
FIG. 11 depicts the structure of FIG. 9 after patterning and etching through the handle layer up to the insulator layer of the SOI substrate.

FIG. 11 depicts the semiconductor structure 900 of FIG. 9 after being flipped for processing of the handle layer 104 of SOI substrate 100. As shown in FIG. 11, recesses 1100, 1102 and 1104 have been created in handle layer 104. As shown, one way to create the recesses in semiconductor structure 900 is to deposit a layer of chromium 1106 on top of handle layer 104, and cover the chromium layer with photoresist 1108. The photoresist is patterned and the chromium removed in the areas over the locations in the handle layer where the recesses are sought to be created. Chromium can be removed, for example, using Chromium Etchant 1020, available from Transene Company, Inc., Danvers, Mass. The handle layer is then etched, for example, using a Bosch process.

Figure 12:
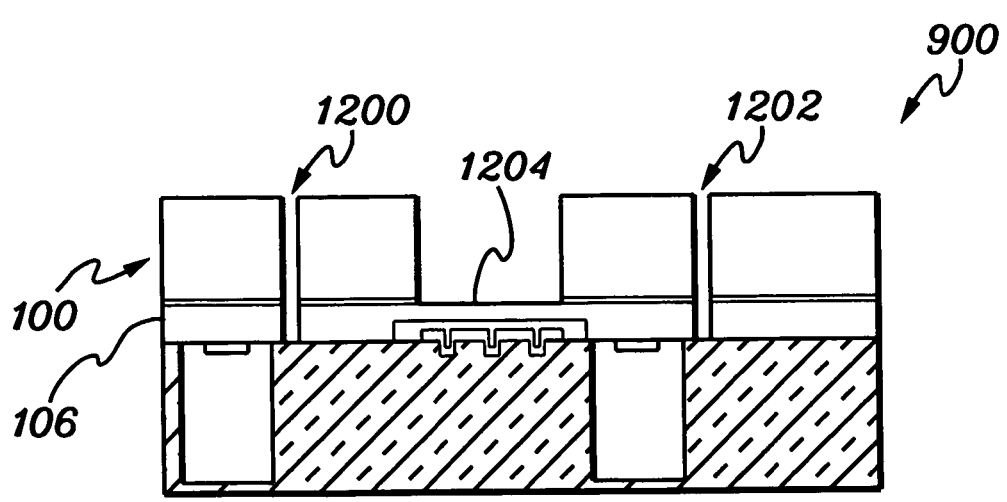
FIG. 12 depicts the structure of FIG. 1 after removal of a portion of the insulator layer of the SOI substrate to create a thin silicon membrane.

FIG. 12 depicts the semiconductor structure 900 of FIG. 11 after selective removal of insulator layer 106 in SOI substrate 100, creating trenches 1200 and 1202, as well as thin silicon membrane or diaphragm 1204. The thickness of the membrane varies, for example, from about 1 micron to about 20 microns, depending on the application.

Figure 13:
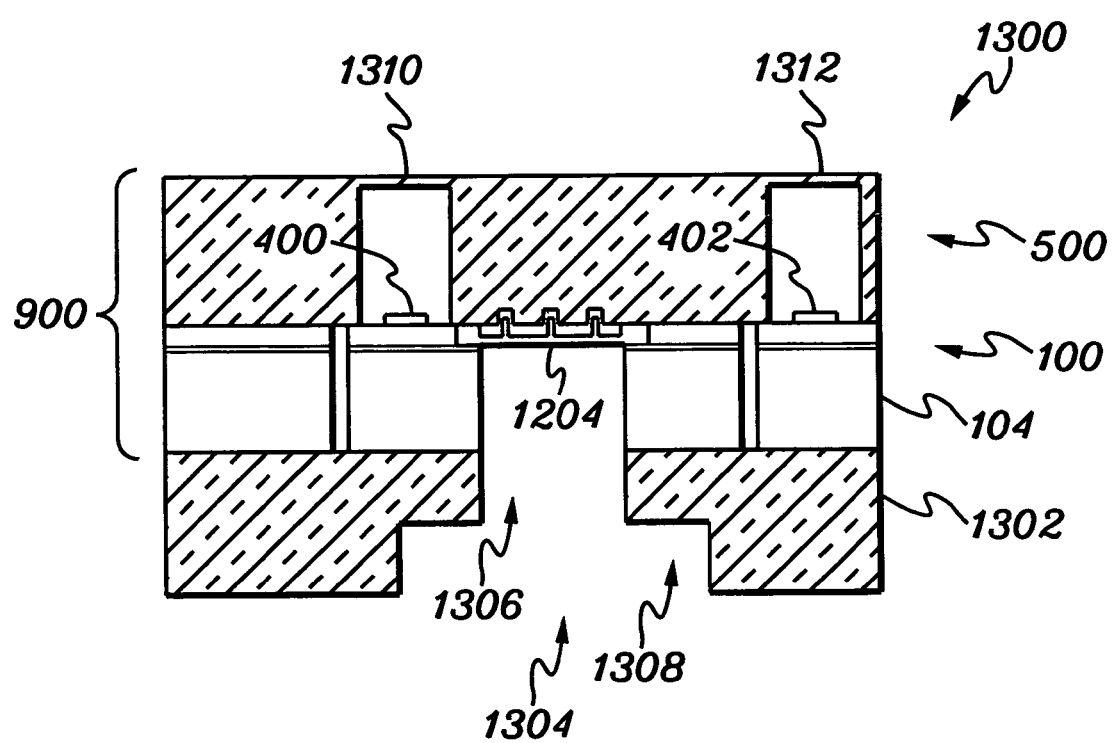
FIG. 13 depicts a pressure sensor, comprising the structure of FIG. 12 after anodically bonding a second glass substrate to the handle layer of the SOI substrate.

FIG. 13 depicts a pressure sensor 1300 in accordance with the present invention. Pressure sensor 1300 comprises semiconductor structure 900 from FIG. 12 anodically bonded at handle layer 104 of SOI substrate 100 to a second glass substrate 1302 having an opening therein 1304 corresponding to the recess in handle layer 104 leading to membrane 1204. Opening 1304 comprises a first portion 1306 corresponding to the recess in the SOI substrate, and a larger, counterbored portion 1308. The counterboring is done to fit the fabricated device to the packaging. As one skilled in the art will know, thin glass covers 1310 and 1312 protect contacts 400 and 402, respectively, during processing and would be removed prior to use. Membrane diameters for the pressure sensor can range, for example, from about 25 microns to about 5000 microns, with a measurement range from about 10 mTorr to about 100 Torr.

Figure 14:
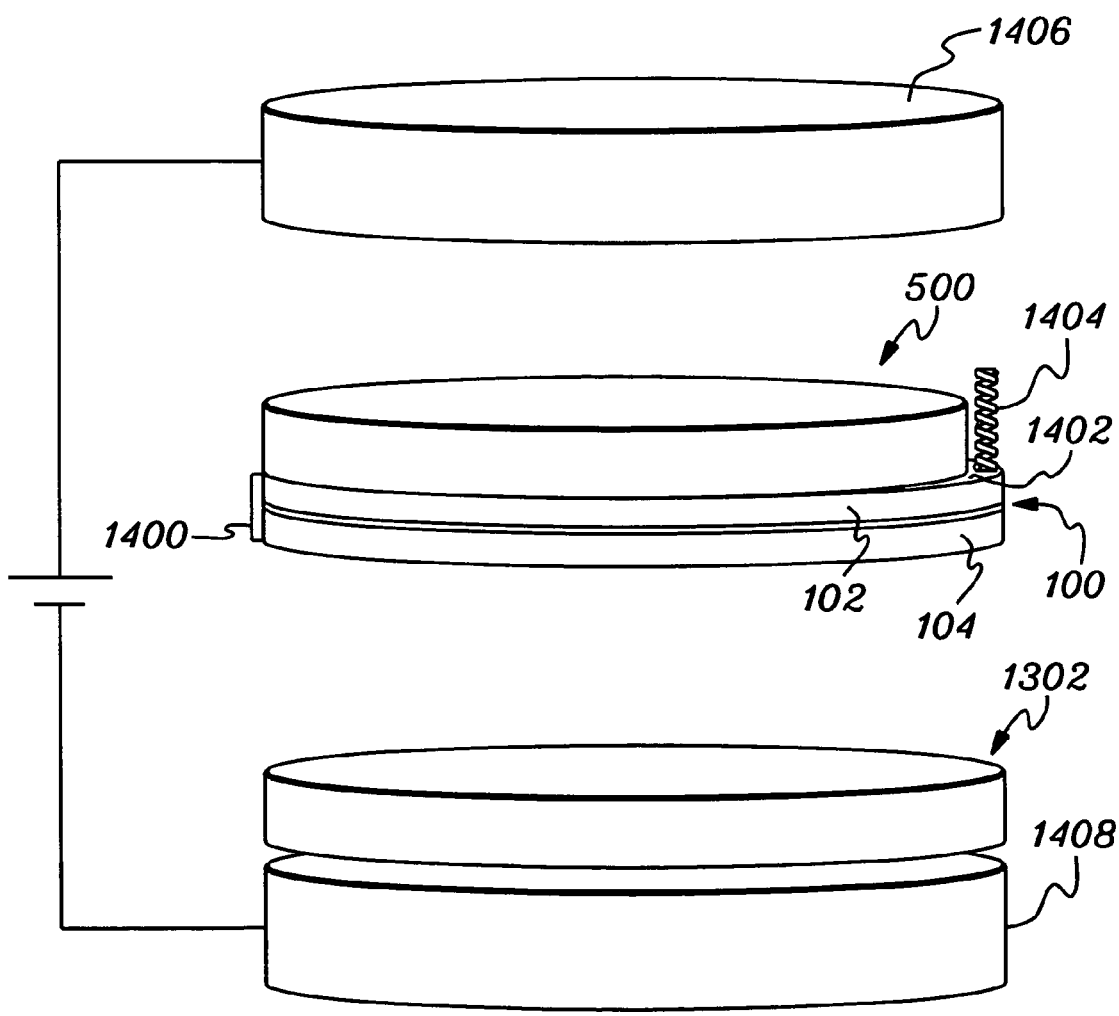
FIG. 14 is an exploded view showing more detail regarding the anodic bonding of FIG. 13.

It should be noted that in creating the anodic bond between SOI substrate 100 and the second glass substrate 1302, there is the potential for debonding of the anodic bond between glass substrate 500 and SOI substrate 100. As shown in FIG. 14, the potential for debonding is addressed by equalizing the electrical potential between both silicon layers of the SOI substrate. As shown in FIG. 14, a conductor 1400 along an edge of the SOI wafer is used, similar to that described with respect to FIG. 10. In addition, glass wafer 500 and SOI wafer 100 are arranged such that the SOI wafer is exposed at area 1402, and a conductor 1404 (e.g., a spiral metal spring) is employed to electrically couple electrode 1406 and device layer 102 of the SOI wafer. Conductor 1400 then provides an electrical path from electrode 1406 to handle layer 104 in the SOI wafer. In this way, the potential difference between the silicon layers of the SOI wafer and electrode is equalized with no potential drop across the glass wafer, thereby preventing debonding of the anodic bond with glass wafer 500 when the SOI wafer and glass wafer 1302 are anodically bonded, using electrodes 1406 and 1408. The result is that the strength of the anodic bonds is roughly equal, since no debonding of the first anodic bond has occurred and the glass wafers comprise the same material.

Figure 15:
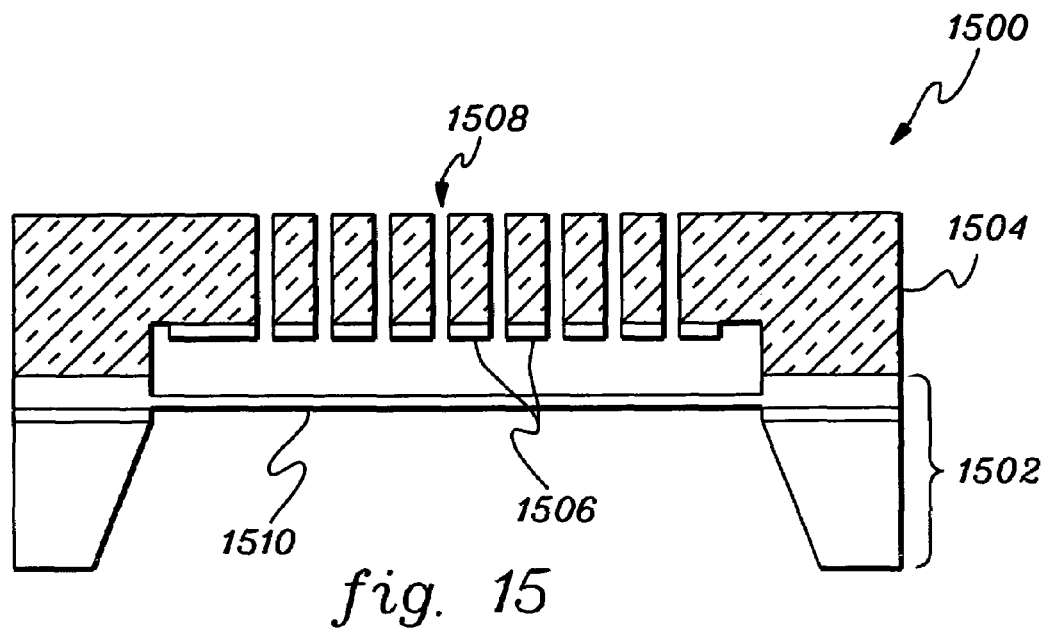
FIG. 15 depicts an acoustic sensor in accordance with the present invention.

FIG. 15 depicts an acoustic sensor 1500 that can be created with the same process flow used to create the pressure sensor, though the mask layout would be different and no second glass substrate is necessary. Acoustic sensor 1500 comprises SOI substrate 1502 and glass substrate 1504 anodically bonded thereto, including a plurality of electrical contacts 1506 similar to those in the pressure sensor, a plurality of openings 1508 in the glass substrate (created, e.g., with ultrasonic drilling), and a thin silicon membrane or diaphragm 1510. The membrane thickness ranges, for example, from about 1 micron to about 30 microns.

Figure 16:
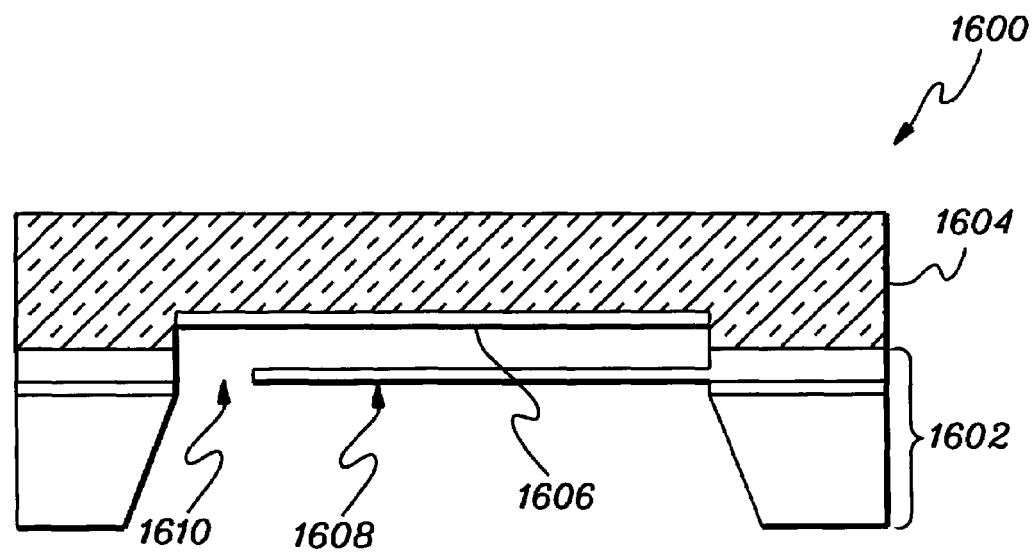
FIG. 16 depicts an accelerometer in accordance with the present invention.

FIG. 16 depicts another device that can be made using the process flow of the present invention with a different mask layout and no second glass substrate. In this case, FIG. 16 depicts an accelerometer 1600. The accelerometer comprises SOI substrate 1602, glass substrate 1604 anodically bonded thereto, electrical contact 1606 and thin silicon membrane 1608 with opening 1610 therein. Lateral dimensions for the accelerometer can range, for example, from about 25 microns to about 5000 microns.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of making a sensor, comprising:
providing a silicon-on-insulator (SOI) substrate having a first silicon layer, a second silicon layer and an insulator layer between the first silicon layer and the second silicon layer;
creating a membrane in the first silicon layer;
anodically bonding a second substrate to the SOI substrate at the first silicon layer;
coupling at least one electrical contact to the second substrate for detecting deflection of the membrane;
anodically bonding a third substrate to the SOI substrate at the second silicon layer; and
creating an opening through the third substrate and the second silicon layer to the membrane, wherein the sensor comprises a pressure sensor.

2. A method of making a sensor, comprising:
providing a silicon-on-insulator (SOI) substrate having a first silicon layer, a second silicon layer and an insulator layer between the first silicon layer and the second silicon layer;
creating a membrane in the first silicon layer;
anodically bonding a second substrate to the SOI substrate at the first silicon layer;
coupling at least one electrical contact to the second substrate for detecting deflection of the membrane; and
anodically bonding a third substrate to the SOI substrate at the second silicon layer, wherein anodically bonding the third substrate to the SOI substrate at the second silicon layer comprises preventing debonding of the second substrate to the first silicon layer.

3. The method claim 2, wherein preventing debonding comprises electrically coupling the second substrate and the first silicon layer.

4. A method of making a sensor, comprising:
providing a silicon-on-insulator (SOI) substrate having a first silicon layer, a second silicon layer and an insulator layer between the first silicon layer and the second silicon layer;
creating a membrane in the first silicon layer;
anodically bonding a second substrate to the SOI substrate at the first silicon layer;
coupling at least one electrical contact to the second substrate for detecting deflection of the membrane; and
creating an opening in the membrane, wherein the sensor comprises an accelerometer.

5. A method of making a sensor, comprising:
providing a silicon-on-insulator (SOI) substrate having a first silicon layer, a second silicon layer and an insulator layer between the first silicon layer and the second silicon layer;
creating a membrane in the first silicon layer;
anodically bonding a second substrate to the SOI substrate at the first silicon layer;
coupling at least one electrical contact to the second substrate for detecting deflection of the membrane; and
creating a plurality of openings in the second substrate opposite the membrane, wherein the sensor comprises an acoustic sensor.

* * * * *

UNITED STATES PATENT AND TRADEMARK OFFICE
CERTIFICATE OF CORRECTION

PATENT NO. : 7,527,997 B2  Page 1 of 1
APPLICATION NO. : 11/101861
DATED : May 5, 2009
INVENTOR(S) : Xu et al.

It is certified that error appears in the above-identified patent and that said Letters Patent is hereby corrected as shown below:

On the Title Page:

In the Abstract (57): Delete "insulator layer by electrically comprising the silicon layers." and insert -- insulator layer by electrically coupling the silicon layers. --

Signed and Sealed this

Twenty-eighth Day of July, 2009

JOHN DOLL
*Acting Director of the United States Patent and Trademark Office*